(12) United States Patent
Wang

(10) Patent No.: US 11,823,595 B2
(45) Date of Patent: Nov. 21, 2023

(54) SUPPORT MEMBER AND FOLDABLE DISPLAY MODULE

(71) Applicant: Wuhan China Star Optoelectronics Semiconductor Display Technology Co., Ltd., Hubei (CN)

(72) Inventor: Wenqiang Wang, Hubei (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 361 days.

(21) Appl. No.: 17/266,595

(22) PCT Filed: Nov. 30, 2020

(86) PCT No.: PCT/CN2020/132750
§ 371 (c)(1),
(2) Date: Feb. 7, 2021

(87) PCT Pub. No.: WO2022/077721
PCT Pub. Date: Apr. 21, 2022

(65) Prior Publication Data
US 2022/0309964 A1  Sep. 29, 2022

(30) Foreign Application Priority Data

Oct. 14, 2020 (CN) .......................... 202011094239.1

(51) Int. Cl.
G09F 9/30 (2006.01)
G06F 1/16 (2006.01)
H05K 7/14 (2006.01)

(52) U.S. Cl.
CPC ............ *G09F 9/301* (2013.01); *G06F 1/1641* (2013.01); *G06F 1/1652* (2013.01); *H05K 7/1438* (2013.01)

(58) Field of Classification Search
CPC combination set(s) only.
See application file for complete search history.

(56) References Cited

U.S. PATENT DOCUMENTS

| | | | | |
|---|---|---|---|---|
| 10,164,208 B2* | 12/2018 | Lee | ........................ | B32B 5/145 |
| 10,194,540 B2* | 1/2019 | Sun | ........................ | H10K 77/111 |
| 10,541,373 B2* | 1/2020 | Park | .................... | H04M 1/0216 |
| 10,916,719 B2* | 2/2021 | Park | ....................... | H10K 50/84 |
| 11,334,117 B2* | 5/2022 | Youn | ..................... | G06F 1/1626 |
| 11,487,327 B2* | 11/2022 | Horiuchi | ............. | H04M 1/0268 |

(Continued)

FOREIGN PATENT DOCUMENTS

| | | |
|---|---|---|
| CN | 107403590 | 11/2017 |
| CN | 108155219 | 6/2018 |

(Continued)

*Primary Examiner* — Lisa Lea-Edmonds

(57) ABSTRACT

The present application provides a support member and a foldable display module. The support member includes at least one bending region and a plurality of non-bending regions. Each bending region is connected between two opposite non-bending regions. The support member further includes a support frame. The support frame includes a first surface and a second surface opposite to each other in a thickness direction of the support member. A portion of the first surface and a portion of the second surface of the support frame corresponding to the non-bending regions are defined with a plurality of first grooves and a plurality of second grooves.

20 Claims, 4 Drawing Sheets

(56) References Cited

U.S. PATENT DOCUMENTS

| | | | |
|---|---|---|---|
| 11,513,560 B2* | 11/2022 | Dong | B32B 9/04 |
| 11,546,986 B2* | 1/2023 | Wang | H05K 1/028 |
| 11,579,658 B2* | 2/2023 | Kim | G06F 1/1652 |
| 2017/0374750 A1* | 12/2017 | Sun | H05K 5/0017 |
| 2019/0173030 A1 | 6/2019 | Kim et al. | |
| 2020/0183457 A1* | 6/2020 | Youn | G06F 1/1641 |
| 2020/0321429 A1 | 10/2020 | Yang et al. | |
| 2021/0026420 A1* | 1/2021 | Zhang | G09F 9/301 |
| 2021/0029232 A1 | 1/2021 | Park et al. | |
| 2021/0165454 A1* | 6/2021 | Dong | G06F 1/1652 |
| 2021/0168929 A1 | 6/2021 | Wang et al. | |
| 2022/0236769 A1* | 7/2022 | Youn | G06F 1/1641 |
| 2022/0399521 A1* | 12/2022 | Kang | B32B 15/20 |

FOREIGN PATENT DOCUMENTS

| | | |
|---|---|---|
| CN | 109891482 | 6/2019 |
| CN | 209232313 | 8/2019 |
| CN | 110400520 | 11/2019 |
| CN | 110853520 | 2/2020 |
| CN | 111261047 | 6/2020 |
| CN | 111508370 | 8/2021 |
| KR | 2018-0040481 | 4/2018 |

* cited by examiner

SUPPORT MEMBER AND FOLDABLE DISPLAY MODULE

RELATED APPLICATIONS

This application is a National Phase of PCT Patent Application No. PCT/CN2020/132750 having International filing date of Nov. 30, 2020, which claims the benefit of priority of Chinese Patent Application No. 202011094239.1 filed on Oct. 14, 2020. The contents of the above applications are all incorporated by reference as if fully set forth herein in their entirety.

FIELD AND BACKGROUND OF THE INVENTION

The present invention is related to the field of display technology, and specifically, to a support member and a foldable display module.

Currently, stainless-steel plates (metal sheets) are generally configured as support layers of foldable display modules. By hollowing out portions of the stainless-steel plates corresponding to bending regions, bending ductility of a portion of the support layers corresponding to the bending regions is increased. Moreover, the stainless-steel plates are relatively thick to ensure that the stainless-steel plates can support screens and transfer resilience forces of module stacks when the stainless-steel plates are bent and flattened, so that the screens can quickly return to a flat state. However, thicker stainless-steel plates will directly increase an overall weight of the foldable display modules. Simply reducing thicknesses of the stainless-steel plates may cause uneven force on the stainless-steel plates and cause warpage. The warpage of the stainless-steel plates is not conductive to good flatness of the foldable display modules.

Therefore, it is necessary to propose a technical solution to ensure that the stainless-steel plates have good flatness while having light weight when configured as support layers.

SUMMARY OF THE INVENTION

The present application aims to provide a support member and a foldable display module with light weight and better flatness.

In order to achieve the above purpose, the present application provides a support member. The support member includes at least one bending region and a plurality of non-bending regions. Each bending region is connected between two opposite non-bending regions. The support member includes a support frame.

The support frame includes a first surface and a second surface opposite to each other in a thickness direction of the support member. A portion of the first surface of the support frame corresponding to one of the non-bending regions is defined with a plurality of first grooves. A portion of the second surface of the support frame corresponding to one of the non-bending regions is defined with a plurality of second grooves.

In the above support member, the first grooves are arranged in an array on the first surface, the second grooves are arranged in an array on the second surface.

Each of the first grooves corresponds to each of the second grooves. An orthographic projection of each of the first grooves on the second surface completely coincides with each of the second grooves when the support member is in a flattened state.

In the above support member, a sum of a depth of each of the first grooves and a depth of each of the second grooves corresponding to each of the first grooves is less than a thickness of the support member. A thickness of a portion of the support frame between each of the first grooves and each of the second grooves corresponding to each of the first grooves is greater than or equal to the depth of each of the first grooves. The thickness of the portion of the support frame between each of the first grooves and each of the second grooves corresponding to each of the first grooves is greater than or equal to the depth of each of the second grooves.

In the above support member, a depth of each of the first grooves and a depth of each of the second grooves are equal, and a thickness of a portion of the support frame between each of the first grooves and each of the second grooves corresponding to each of the first grooves is equal to the depth of each of the first grooves.

In the above support member, the first grooves and the second grooves are arranged in an array along a length direction and a width direction of the support member.

In a same one of the non-bending regions, a distance between any two adjacent first grooves arranged along the length direction of the support member and a distance between any two adjacent first grooves arranged along the width direction of the support member are equal to a first pitch.

In the same one of the non-bending regions, a distance between any two adjacent second grooves arranged along the length direction of the support member and a distance between any two adjacent second grooves arranged along the width direction of the support member are equal to a second pitch, and the first pitch is equal to the second pitch.

In the above support member, the first pitch is greater than or equal to 6 millimeters, and the second pitch is greater than or equal to 6 millimeters.

In the above support member, a distance between the first grooves adjacent to an edge of the support frame and the edge of the support frame is greater than or equal to a distance between any two adjacent first grooves in a same one of the non-bending regions.

In the above support member, a cross-sectional shape of each of the first grooves is same as or similar to a shape of each of the non-bending regions, and a cross-sectional shape of each of the second grooves is same as or similar to the shape of each of the non-bending regions.

In the above support member, cross-sectional shapes of each of the first grooves and each of the second grooves include at least one of square, rectangular, or circular.

In the above support member, each end of two opposite ends of the support frame includes two first corners, and a side surface of each of the first corners is provided with a first arc surface.

In the above support member, each of the first grooves includes four second corners, and a side surface of each of the second corners is provided with a second arc surface.

Each of the second grooves includes four third corners, and a side surface of each of the third corners is provided with a third arc surface.

The second arc surface of one of the second corners adjacent to one of the first corners is coaxial with the first arc surface of one of the first corners.

The third arc surface of one of the third corners adjacent to one of the first corners is coaxial with the first arc surface of one of the first corners.

In the above support member, the first grooves and the second grooves are filled with plastic layers.

In the above support member, material of the plastic layers includes hard resin.

In the above support member, material of the support frame includes metal.

In the above support member, a portion of the support frame corresponding to the bending region is defined with a plurality of through holes passing through the support member in the thickness direction. The through holes are symmetrically arranged with a bending axis of the support member. Any two adjacent through holes are staggered in a direction perpendicular to the bending axis. A length direction of each of the through holes is parallel to the bending axis. A width direction of each of the through holes is perpendicular to the bending axis.

A cross-sectional shape of each of the through holes includes two symmetrical U-shaped segments with openings facing each other and two arc segments connecting the two U-shaped segments. Each of the arc segments is connected to same ends of the two U-shaped segments. Openings of the two arc segments face each other.

In the above support member, an angle of each of the arc segments ranges from 120 degrees to 150 degrees.

In the above support member, in the direction perpendicular to the bending axis, a pitch between two adjacent through holes is greater than 0 micrometer and less than or equal to 100 micrometers. A width of each of the through holes is greater than 0 micrometer and less than or equal to 200 micrometers.

In the above support member, a length of each of the through holes is greater than or equal to 3.7 millimeters.

In the above support member, in the direction perpendicular to the bending axis, the pitch between two adjacent through holes is greater than or equal to 60 micrometers, the width of each of the through holes is greater than or equal to 120 micrometers, and the length of each of the through holes is less than or equal to 5.7 millimeters.

A foldable display module includes:

a flexible display panel;

the above support member; and an adhesive layer disposed between the flexible display panel and the support member.

The present application provides the support member and the foldable display module. The support member includes at least one bending region and the plurality of non-bending regions. Each bending region is connected between two opposite non-bending regions. The support member further includes the support frame. The support frame includes the first surface and the second surface opposite to each other in the thickness direction of the support member. The portion of the first surface of the support frame corresponding to one of the non-bending regions is defined with the plurality of first grooves. The portion of the second surface of the support frame corresponding to one of the non-bending regions is defined with the plurality of second grooves. The first grooves and the second grooves are respectively defined on two opposite surfaces of portions of the support frame corresponding to the non-bending regions in the thickness direction of the support member. While a weight of the support member is reduced, an uneven stress distribution of the support frame causing warpage of the support member is also relieved.

DESCRIPTION OF SPECIFIC EMBODIMENTS OF THE INVENTION

The technical solution of the present application embodiment will be clarified and completely described with reference accompanying drawings in embodiments of the present application embodiment. Obviously, the present application described parts of embodiments instead of all of the embodiments. Based on the embodiments of the present application, other embodiments which can be obtained by a skilled in the art without creative efforts fall into the protected scope of the present application.

Figure 1:
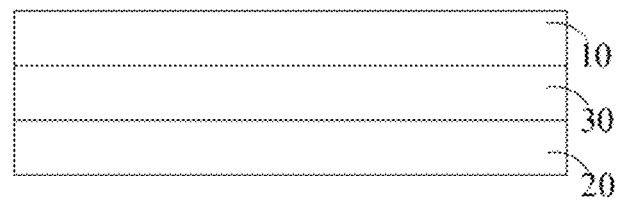
FIG. 1 is a schematic diagram of a foldable display module of an embodiment of the present application.

Please refer to FIG. 1, which is a schematic diagram of a foldable display module of an embodiment of the present application. The foldable display module 100 includes a flexible display panel 10, a support member 20, and an adhesive layer 30.

The flexible display panel 10 includes a backplate, a flexible organic light-emitting diode display panel, a polarizer, and a protective cover plate sequentially stacked. The backplate is disposed on a side adjacent to the support member 20, and any two adjacent functional layers (any one of the backplate, the flexible organic light-emitting diode display panel, the polarizer, and the protective cover plate) are bonded by a transparent adhesive layer. The flexible organic light-emitting diode display panel is configured to emit visible light, and the flexible organic light-emitting diode display panel has a foldable characteristic.

The adhesive layer 30 is an optical adhesive layer. The support member 20 is bonded to the flexible display panel 10 through the adhesive layer 30. Utilizing characteristics of low modulus, high elasticity, and stress resistance of the adhesive layer 30, a stress transmission in the support member 20 is effectively relieved when the foldable display module is bent, and the functional layers in the flexible display panel 10 are protected.

Figure 2:
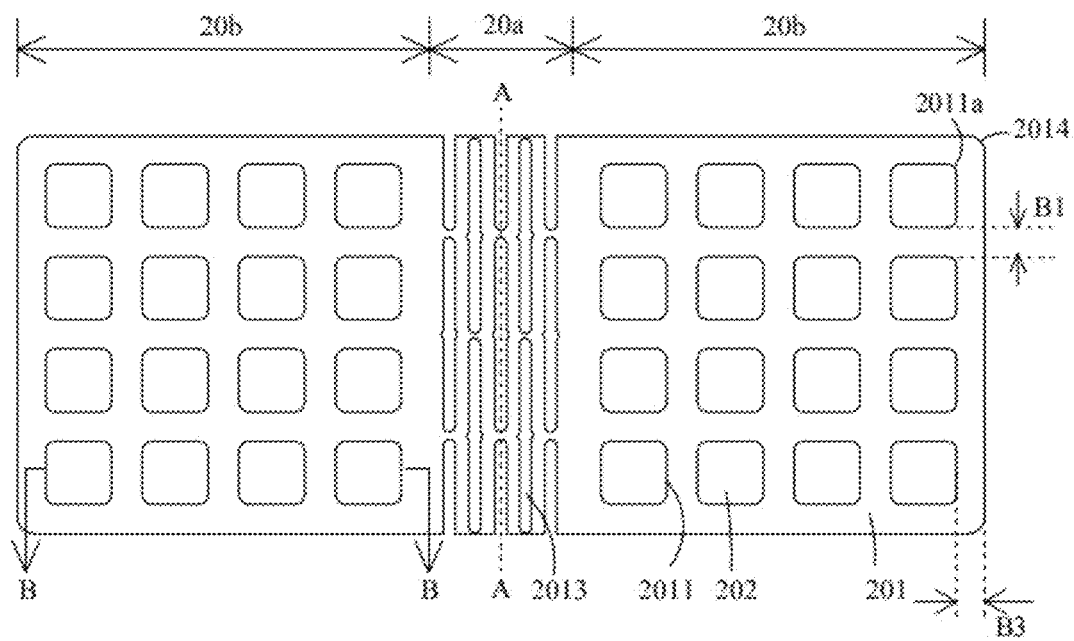
FIG. 2 is a schematic plan view of a support member in FIG. 1.
Figure 3:
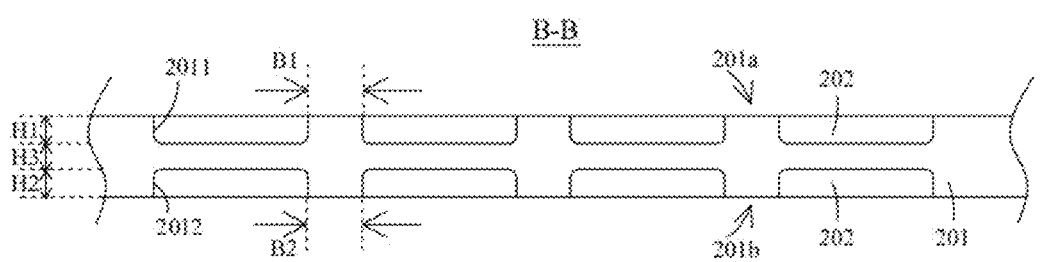
FIG. 3 is a schematic cross-sectional view of FIG. 2 taken along line B-B.

Please refer to FIGS. 2 and 3. FIG. 2 is a schematic plan view of the support member in FIG. 1, and FIG. 3 is a schematic cross-sectional view of FIG. 2 taken along line B-B. The support member 20 supports the flexible display panel 10. The support 20 is configured to increase a bending restoring force of the foldable display module in a bent state and a flatness in a flat state.

The support member 20 includes at least one bending region 20a and a plurality of non-bending regions 20b. Each bending region 20a is connected between two opposite non-bending regions 20b. The bending region 20a of the support member 20 is same as a bending region of the foldable display module 100, and the non-bending regions 20b of the support member 20 are same as the non-bending regions of the foldable display module 100. Specifically, the support member 20 includes one bending region 20a and two non-bending regions 20b. The two non-bending regions 20b are symmetrically connected to two opposite sides of the bending region 20a. A shape and a size of the two non-bending regions 20b are same. It can be understood that a number of bending regions 20a can be two, and correspondingly, a number of non-bending regions 20b is three.

The support member 20 includes a support frame 201 and plastic layers 202. The support frame 201 includes a first surface 201a and a second surface 201b opposite to each other in a thickness direction of the support member 20. A portion of the first surface 201a of the support frame 201 corresponding to one of the non-bending regions 20b is defined with a plurality of first grooves 2011. A portion of the second surface 201b of the support frame 201 corresponding to one of the non-bending regions 20b is defined with a plurality of second grooves 2012.

Figure 4:
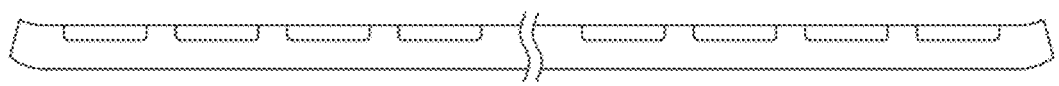
FIG. 4 is a schematic diagram of grooves defined on a surface of the support member.

Please refer to FIG. 4, which is a schematic diagram of grooves defined on a surface of the support member. It can be known from FIG. 4 that etching grooves on one surface of the support member cause the support member to warp, and a main reason is that the grooves etched on one surface of the support member cause an uneven residual stress distribution in the support member to cause warpage.

The foldable display module of the present application is respectively defined with the first grooves and the second grooves on portions of two opposite surfaces of the support frame of the support member corresponding to the non-bending regions, so as to reduce a weight of the support frame, and a weight of the support member is accordingly reduced, which is beneficial to reduce a weight of the foldable display module. Because the two opposite surfaces of the support frame are respectively defined with the first grooves and the second grooves, stress distributions of the two opposite surfaces of the support frame tends to be same, preventing the warpage caused by a residual stress concentration on one side of the support frame. Therefore, the support member has better flatness, and thus the foldable display module has good flatness.

The first grooves 2011 are arranged in an array on the first surface 201a, so that the stress distribution on the first surface 201a of the support frame 201 becomes more uniform. The second grooves 2012 are arranged in an array on the second surface 201b, so that the stress distribution on the second surface 201b of the support frame 201 becomes more uniform. Specifically, as shown in FIG. 2, the first grooves 2011 and the second grooves 2012 are arranged in arrays along a length direction and a width direction of the support member 20.

Figure 5:
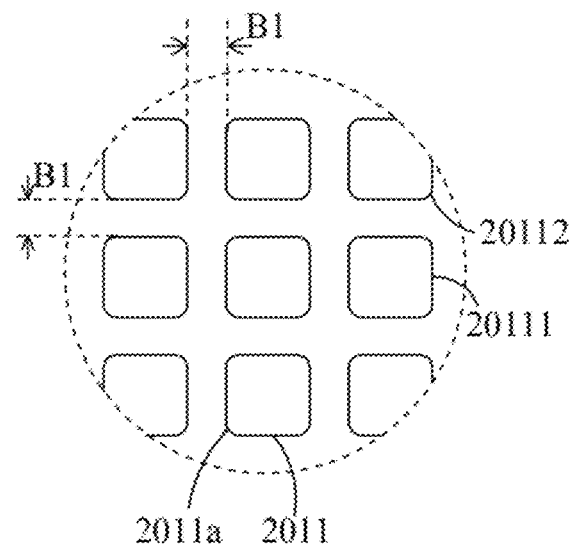
FIG. 5 is a schematic partial enlarged view of a non-bending region of the support member in FIG. 2.

As shown in FIGS. 3 and 5, FIG. 5 is schematic partial enlarged view of a non-bending region of the support member in FIG. 2, the support frame 201 is defined with the first grooves 2011 arranged in an array on the portion of the first surface 201a corresponding to each of the non-bending regions 20b. In a same one of the non-bending regions 20b, a distance between any two adjacent first grooves 2011 arranged along the length direction of the support member 20 and a distance between any two adjacent first grooves 2011 arranged along the width direction of the support member 20 are equal to a first pitch B1. This further ensures that the stress distribution on the first surface 201a of the support frame 201 becomes more uniform.

The support frame 201 is defined with the second grooves 2012 arranged in an array on the portion of the second surface 201b corresponding to each of the non-bending regions 20b. In the same one of the non-bending regions 20b, a distance between any two adjacent second grooves 2012 arranged along the length direction of the support member 20 and a distance between any two adjacent second grooves 2012 arranged along the width direction of the support member 20 are equal to a second pitch B2. This further ensures that the stress distribution on second surface 201b of the support frame 201 becomes more uniform.

The first pitch B1 is greater than or equal to 6 millimeters, and the second pitch B2 is greater than or equal to 6 millimeters, which helps to ensure an overall rigidity and a supportability of the support frame 201. For example, the first pitch B1 is 6 millimeters, 7 millimeters, 8 millimeters, 9 millimeters, and 15 millimeters, and the second pitch B2 is 6 millimeters, 7 mm, 8 millimeters, 9 millimeters, and 15 millimeters.

Each of the first grooves 2011 corresponds to each of the second grooves 2012. An orthographic projection of each of the first grooves 2011 on the second surface 201b completely coincides with each of the second grooves 2012 when the support member 20 is in a flattened state. The first pitch B1 is equal to the second pitch B2, so the first grooves 2011 on the first surface 201a and the second grooves 2012 on the second surface 201b are up-down symmetrically arranged. This is beneficial for the stress distributions on the first surface 201a and the second surface 201b of the support frame 201 to tend to be same, which is more beneficial to prevent the support frame 201 from causing the warpage, so that the support 20 has good flatness. The term "completely coincide" means that shapes and sizes of a pattern corresponding to a cross-section of each of the first grooves 2011 and a pattern corresponding to a cross-section of each of the second grooves 2012 are exactly same.

Understandably, the first grooves 2011 and the second grooves 2012 can also be up-down staggered. Compared with a configuration of the first grooves 2011 and the second grooves 2012 being up-down staggered, a configuration of the first grooves 2011 and the second grooves 2012 being up-down symmetrically arranged can better ensure that stresses on the support member 20 are more uniformly distributed, thereby preventing the support member 20 from causing the warpage.

A third pitch B3 between the first grooves 2011 adjacent to an edge of the support frame 201 and the edge of the support frame 201 is greater than or equal to the first pitch B1 between any two adjacent first grooves 2011 in the same one of the non-bending regions 20b. In this way, a supportability of the edge of the first surface 201a of the support member 20 and the flatness during a bending process are increased. Because the second grooves 2012 and the first grooves 2011 are up-down symmetrically arranged, a distance between the second grooves 2012 adjacent to an edge of the support frame 201 and the edge of the support frame 201 is equal to the third pitch B3 as well.

Specifically, the third pitch B3 is greater than or equal to 6 millimeters and less than or equal to 10 millimeters. If the third pitch B3 is too narrow, a rigidity of the edge of the support member 20 during the bending process of the foldable display module 100 is small, which caused the support member 20 to warp, and a supportability of the support member 20 is poor. If the third pitch B3 is too wide, the weight of the support member 20 becomes heavy, which is not conducive to a weight reduction of the foldable display module 100.

The greater a thickness of the support member 20, a better the bending restoring force of the support member 20. However, a thicker thickness causes the weight of the support member 20 to become too heavy. The thickness of the support member 20 ranges from 120 micrometers to 180 micrometers to ensure that the support member 20 has a good bending restoring force and prevent the support member 20 from being heavy. For example, the thickness of the support 20 is 130 micrometers, 140 micrometers, 150 micrometers, and 155 micrometers.

A sum of a depth H1 of each of the first grooves 2011 and a depth H2 of each of the second grooves 2012 corresponding to each of the first grooves 2011 is less than a thickness of the support member 20. A thickness of a portion of the support frame 201 between each of the first grooves 2011 and each of the second grooves 2012 corresponding to each of the first grooves 2011 is greater than or equal to the depth H1 of each of the first grooves 2011 and the depth H2 of each of the second grooves 2012. Therefore, a rigidity of portions of the support frame 201 defined with the first grooves 2011 and the second grooves 2012 is ensured, and a thickness of the portions of the support frame 201 defined with the first grooves 2011 and the second grooves 2012 is prevented from being too thin to cause the bending restoring force of the support member 20 to be poor during the bending process.

Specifically, the depth H1 of each of the first grooves 2011 and the depth H2 of each of the second grooves 2012 are equal. A thickness H3 of a portion of the support frame 201 between each of the first grooves 2011 and each of the second grooves 2012 corresponding to each of the first grooves 2011 is equal to the depth H1 of each of the first grooves 2011. The stress distribution of the support frame 201 in the thickness direction of the support member 20 becomes uniform while the bending restoring force of the support 20 is ensured. Moreover, the weight of the support member 20 is minimized, and a manufacturing process of the support member 20 is simplified. For example, the depth H1, the depth H2, and the thickness H3 can all be 50 micrometers.

The present application treated two surfaces of the portions of the support member corresponding to the non-bending regions by dry etching and followed by a constant temperature aging treatment to form a support frame. The support member is prevented from being etched on one surface, causing an uneven residual stress distribution in a partial structure and causing the warpage in an entire surface eventually. A constant temperature ranges from 190° C. to 210° C., and a time ranges from 22 h to 26 h. Specifically, for example, the constant temperature is 200° C. and the time is 24 h.

Each end of two opposite ends of the support frame 201 includes two first corners. A side surface of each of the first corners is provided with a first arc surface 2014. Because an arc surface is more conducive to stress dispersion than a right-angled surface, it can prevent a stress concentration of the support frame 201 at the first corners and cause warpage.

Each of the first grooves 2011 includes four second corners. A side surface of each of the second corners is provided with a second arc surface 2011a. Each of the second grooves 2012 includes four third corners. A side surface of each of the third corners is provided with a third arc surface. The second arc surface 2011a of one of the second corners adjacent to one of the first corners is coaxial with the first arc surface 2014 of one of the first corners, so as to further prevent the first corners of the support member 20 from causing warpage. The third arc surface of one of the third corners adjacent to one of the first corners is coaxial with the first arc surface 2014 of one of the first corners, so as to further prevent the first corners of the support member 20 from causing warpage.

A cross-sectional shape of each of the first grooves 2011 is same as or similar to a shape of each of the non-bending regions 20b. A cross-sectional shape of each of the second grooves 2012 is same as or similar to the shape of each of the non-bending regions 20b. These make the first grooves 2011 and the second grooves 2012 adapt to the shapes of the non-bending regions 20b, and further prevent the support frame 201 from causing warpage. The cross-sectional shapes of each of the first grooves 2011 and each of the second grooves 2012 include at least one of square, rectangular, or circular.

Specifically, as shown in FIGS. 2 and 5, the cross-sectional shape of each of the first grooves 2011 includes four straight line segments 20111 and four first arc segments 20112. Two adjacent straight line segments 20111 are connected by a first arc segment 20112. The four straight line segments 20111 have a same length, and the four first arc segments 20112 are same. The cross-sectional shape of each of the first grooves 2011 corresponds to a shape of square with right-angle corners rounded. The cross-sectional shape of each of the second grooves 2012 is same as the cross-sectional shape of each of the first grooves 2011. The shape of each of the non-bending regions 20b corresponds to a shape of square with right-angle corners rounded, and corresponding arcs rounded from the right-angle corners are positioned on an outer side of the support member 20.

It should be explained that the term "same shape" means that the shape of each of the non-bending regions 20b is exactly same as the shape of each of the first grooves 2011, for example, both of them are square or rectangular. The term "similar shape" means that the shape of each of the non-bending regions 20b and the shape of each of the first grooves 2011 are approximately same, for example, the shape of each of the non-bending regions 20b is square, and the shape of each of the first grooves 2011 is square with right-angle corners chamfered. Alternatively, the shape of each of the non-bending regions 20b is partial square with right-angle corners and rounded corners, and the shape of each of the first grooves 2011 is square or square with all four right-angle corners rounded.

As shown in FIG. 3, the first grooves 2011 and the second grooves 2012 are filled with the plastic layers 202. The plastic layers 202 fill every first grooves 2011 and every second grooves 2012 to ensure that an entire support member 20 has good flatness.

Material of the plastic layers 202 includes hard resin, so the plastic layers 202 have a certain hardness. The plastic layers 202 can provide support strength while the plastic layers 202 are configured to replace portions of the support frame to reduce an overall weight of the support member 20. The hard resin includes but is not limited to an organic glass and hard phenolic.

Material of the support frame 201 includes metal. The material of the support frame 201 is stainless steel, so that the support member has good bending recovery force and good support. An allowable stress of a selection of the stainless steel is greater than or equal to 1600 MPa, for example, the allowable stress of the selection of the stainless steel is 1700 MPa, 1800 MPa, etc.

Figure 6:
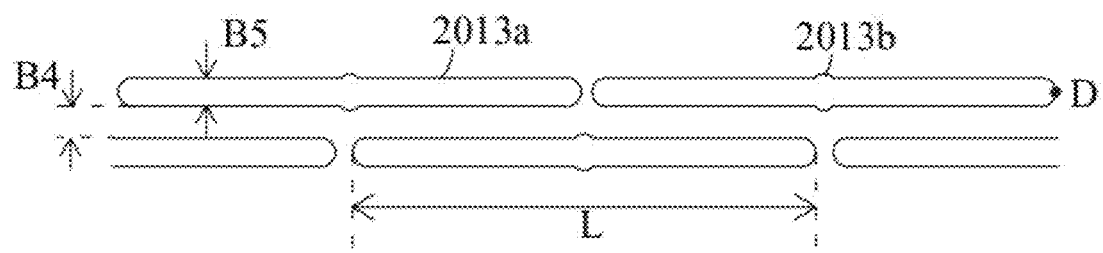
FIG. 6 is a schematic partial enlarged view of a bending region of the support member in FIG. 2.

As shown in FIGS. 2 and 6, FIG. 6 is a schematic partial enlarged view of a bending region of the support member in FIG. 2. A portion of the support frame 201 corresponding to the bending region 20a is defined with a plurality of through holes 2013 passing through the support member 20 in the thickness direction. The through holes 2013 are symmetrically arranged with a bending axis of the support member 20. Any two adjacent through holes 2013 are staggered in a direction perpendicular to the bending axis A-A. A length direction of each of the through holes 2013 is parallel to the bending axis A-A. A width direction of each of the through holes 2013 is perpendicular to the bending axis A-A. Because the portion of the support frame 201 corresponding to the bending region 20a is defined with the through holes 2013 passing through the support member 20 in the thickness direction, continuity of a metal support structure on an entire surface of the support frame 201 is changed, which effectively reduces a tensile modulus of an overall structure of the support frame 201 and improves ductility of the bending regions 20a of the support member 20.

A cross-sectional shape of each of the through holes 2013 includes two symmetrical U-shaped segments 2013a with openings facing each other and two second arc segments 2013b connecting the two U-shaped segments 2013a. Each of the second arc segments 2013b is connected to same ends of the two U-shaped segments 2013a. Openings of the two second arc segments 2013b face each other. The two U-shaped segments 2013a are transitionally connected by the second arc segments 2013b to reduce a stress concentration caused by a structural mutation of the U-shaped segments 2013a under an external force of the through holes 2013.

It should be explained that, during the bending process of the support member 20, stresses are mainly concentrated at a vertex D and a position adjacent to the vertex D of each of the U-shaped segments 2013a. Excessive stresses at the vertex D and the position adjacent to the vertex D cause a fracture failure of each of the through holes 2013.

In this embodiment, an angle of each of the second arc segments 2013a ranges from 120 degrees to 150 degrees. The angle of each of the second arc segments 2013b being less than 120 degrees or greater than 150 degrees causes excessive stresses concentrated on the vertex D and the position adjacent to the vertex D of each of the U-shaped segments 2013a during a stretching and deformation process of each of the through holes 2013, thereby increasing a risk of the fracture failure of each of the through holes 2013. The angle of each of the second arc segments 2013b can be 120 degrees, 140 degrees, and 145 degrees.

A width B5 of each of the through holes 2013 is greater than a pitch B4 between two adjacent through holes 2013 in the direction perpendicular to the bending axis A-A, and the width B5 of each of the through holes 2013 is less than a length L of each of the through holes 2013, so as to reduce a maximum stress at the vertex D of each of the U-shaped segments 2013a of each of the through holes 2013 and the position adjacent to the vertex D during the bending process of the support member 20.

Specifically, in the direction perpendicular to the bending axis A-A, the pitch B4 between two adjacent through holes 2013 is greater than 0 micrometer and less than or equal to 100 micrometers, and the width B5 of each of the through holes 2013 is greater than 0 micrometer and less than or equal to 200 micrometers, so as to reduce the maximum stress at the vertex D of each of the U-shaped segments 2013a of each of the through holes 2013 and the position adjacent to the vertex D during the bending process, thereby reducing a risk of failure of the support member 20.

The length L of each of the through holes 2013 is greater than or equal to 3.7 millimeters, so as to further reduce the maximum stress at the vertex D of each of the U-shaped segments 2013a of each of the through holes 2013 and the position adjacent to the vertex D during the bending process.

When the allowable stress of the stainless steel for the support frame 201 is greater than or equal to 1600 MPa, a bending fatigue limit value can be taken as 800 MPa as a reference. The pitch B4 being less than or equal to 100 micrometers is beneficial to reduce the risk of fracture failure of the support. The length L being greater than or equal to 3.7 millimeters is beneficial to reduce the risk of fracture failure of the support. The width B5 being less than or equal to 200 micrometers is beneficial to reduce the risk of fracture failure of the support.

Furthermore, in the direction perpendicular to the bending axis A-A, the pitch B4 between two adjacent through holes is greater than or equal to 60 micrometers. The portion of the support frame 201 corresponding to the bending region is prevented from being too soft and losing the supportability and the bending restoring force caused by the pitch B4 being too narrow, thereby adapting a process accuracy and ensuring that the maximum stress at the vertex D of each of the U-shaped segments 2013a of each of the through holes 2013 and the position adjacent to the vertex D during the bending process is relatively small. A balance between ensuring the supportability and the bending restoring force of the portion of the support frame 201 corresponding to the bending region and reducing the maximum stress of the portion of the support frame 201 corresponding to the bending region during the bending process is achieved. The width of each of the through holes 2013 is greater than or equal to 120 micrometers, thereby adapting a process accuracy and ensuring that the maximum stress at the vertex D of each of the U-shaped segments 2013a of each of the through holes 2013 and the position adjacent to the vertex D during the bending process is relatively small. The length of each of the through holes 2013 is less than or equal to 5.7 millimeters. A hollow region of the portion of the support frame 201 corresponding to the bending region is prevented from being too large and losing the supportability and the bending restoring force caused by the length of each of the through holes 2013 being too long, thereby ensuring that the maximum stress at the vertex D of each of the U-shaped segments 2013a of each of the through holes 2013 and the position adjacent to the vertex D during the bending process is relatively small. A balance between ensuring the supportability and the bending restoring force of the portion of the support frame 201 corresponding to the bending region and reducing the maximum stress of the portion of the support frame 201 corresponding to the bending region during the bending process is achieved.

The pitch B4 between two adjacent through holes 2013 can be 20 micrometers, 40 micrometers, 60 micrometers, and 80 micrometers. The width B5 of each of the through holes 2013 can be 20 micrometers, 40 micrometers, 60 micrometers, 80 micrometers, 100 micrometers, 120 micrometers, 150 micrometers, and 180 micrometers. The length L of each of the through holes 2013 is 4 millimeters, 4.5 millimeters, 5 millimeters, and 6 millimeters.

Figure 7:
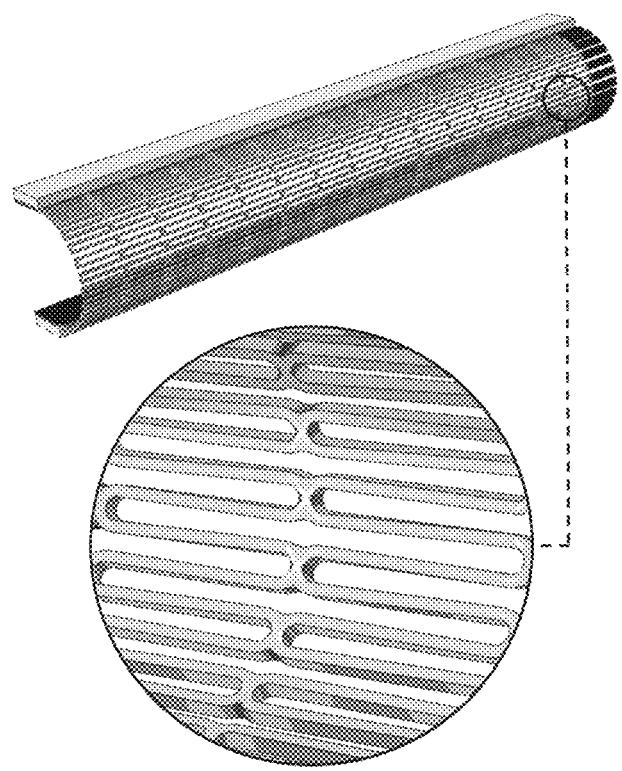
FIG. 7 is a stress simulation diagram of the bending region of the support member with a bending radius of R=1.5 mm.

Please refer to FIG. 7, which is a stress simulation diagram of the bending region of the support member with a bending radius of R=1.5 mm. The present application simulates a bending radius of the bending region 20a of the support member 20 to be 1.5 mm and studies an influence of the pitch B4, the width B5, and the length L on the maximum stress at the vertex D of each of the U-shaped segments 2013a of each of the through holes 2013 and the position adjacent to the vertex D. A simulation results are shown in Tables 1-3. Table 1 shows that the width B5 is 200 micrometers, and the length L is 3.7 millimeters. Table 2 shows that the pitch B4 is 100 micrometers, and the length L is 3.7 millimeters. Table 3 shows that the pitch B4 is 100 micrometers, and the width B5 is 200 micrometers.

TABLE 1 correspondences between the pitch B4 and the maximum stress
at the vertex D of each of the U-shaped segments of each of
the through holes and the position adjacent to the vertex D

| | Pitch B4 (micrometer) | | | | | |
|---|---|---|---|---|---|---|
| | 60 | 80 | 100 | 120 | 140 | 160 |
| Stress (MPa) | 421.2 | 661.5 | 761.2 | 861.5 | 1061.3 | 1461.3 |

TABLE 2 correspondences between the width B5 and the maximum stress
at the vertex D of each of the U-shaped segments of each of
the through holes and the position adjacent to the vertex D

| | Width B5 (micrometer) | | | | | |
|---|---|---|---|---|---|---|
| | 120 | 150 | 200 | 220 | 250 | 300 |
| Stress (MPa) | 406.3 | 524.2 | 678.2 | 863.2 | 1025.3 | 1650.3 |

TABLE 3 correspondences between the length L and the maximum stress
at the vertex D of each of the U-shaped segments of each of
the through holes and the position adjacent to the vertex D

| | Length L (millimeter) | | | | | |
|---|---|---|---|---|---|---|
| | 3 | 3.7 | 4.2 | 4.7 | 5.2 | 5.7 |
| Stress (MPa) | 1020.2 | 820.3 | 756.3 | 682.1 | 602.3 | 523.6 |

It can be seen from Table 1 that when the width B5 is 200 micrometers and the length L is 3.7 millimeters, with the pitch B4 increases from 60 micrometers to 160 micrometers, the maximum stress at the vertex D of each of the U-shaped segments of each of the through holes and the position adjacent to the vertex D shows an increasing trend. Therefore, within a certain range, the smaller the pitch B4, the smaller the maximum stress at the vertex D of each of the U-shaped segments of each of the through holes and the position adjacent to the vertex D.

It can be seen from Table 2 that when the pitch B4 is 100 micrometers and the length L is 3.7 millimeters, with the width B5 increases from 120 micrometers to 300 micrometers, the maximum stress at the vertex D of each of the U-shaped segments of each of the through holes and the position adjacent to the vertex D shows an increasing trend. Therefore, within a certain range, the smaller the width B5, the smaller the maximum stress at the vertex D of each of the U-shaped segments of each of the through holes and the position adjacent to the vertex D.

It can be seen from Table 3 that when the pitch B4 is 100 micrometers and the width B5 is 200 micrometers, with the length L increases from 3 millimeters to 5.7 millimeters, the maximum stress at the vertex D of each of the U-shaped segments of each of the through holes and the position adjacent to the vertex D shows an decreasing trend. Therefore, within a certain range, the greater the length L, the smaller the maximum stress at the vertex D of each of the U-shaped segments of each of the through holes and the position adjacent to the vertex D.

According to Tables 1-3, when the pitch B4 changes by 20 micrometers, the maximum stress correspondingly changes by more than 100 MPa. When the width B5 changes by 20 micrometers to 50 micrometers, the maximum stress correspondingly changes by more than 100 MPa. When the length L changes by 0.5 millimeters to 0.7 millimeters, the maximum stress correspondingly changes by more than 80 MPa. The pitch B4 and the width B5 are key factors that affect the maximum stress at the vertex D of each of the U-shaped segments of each of the through holes and the position adjacent to the vertex D during the bending process. The length L is a secondary factor that affects the maximum stress at the vertex D of each of the U-shaped segments of each of the through holes and the position adjacent to the vertex D during the bending process.

In addition, the present application takes a configuration that non-bending regions of a support member is not defined with first grooves and second grooves, and a bending region is same as this embodiment as a comparison embodiment. Results of comparing weights and resilience forces of the support members of the comparison embodiment with this embodiment are shown in Table 4 as follows. Thicknesses of the support member of the comparison embodiment and the support member of this embodiment are both 150 micrometers, and depths of the first grooves and the second grooves in this embodiment are both 50 micrometers, and thicknesses of the plastic layers are 50 micrometers.

TABLE 4 weights and resilience forces of the support members
of the comparison embodiment and this embodiment

| | weights (g) | Resilience force (N) |
|---|---|---|
| Comparison embodiment | 14.6 | 6.6 |
| This embodiment | 8.1 | 6.35 |

It can be seen from Table 4 that the weight of the support member in this embodiment is reduced by 44.5% compared to the weight of the support member in the comparison embodiment. However, the resilience force of the support member of this embodiment has no significant change compared to the resilience force of the support of the comparative example. Therefore, by symmetrically arranging the first grooves and the second grooves on two opposite surfaces of the support member and filling the first grooves and the second grooves with the plastic layers, the weight of the support member can be significantly reduced without affecting the bending restoring force of the support member.

The description of embodiments above is only for helping to understand technical solutions of the present application and its core idea. Understandably, for a person of ordinary skill in the art can make various modifications of the technical solutions of the embodiments of the present application above. However, it does not depart from the scope of the technical solutions of the embodiments of the present application.

What is claimed is:

1. A support member, comprising at least one bending region and a plurality of non-bending regions;
wherein each bending region is connected between two opposite non-bending regions;
wherein the support member further comprises a support frame, the support frame comprises a first surface and a second surface opposite to each other in a thickness direction of the support member, a portion of the first surface of the support frame corresponding to one of the non-bending regions is defined with a plurality of first grooves, and a portion of the second surface of the support frame corresponding to one of the non-bending regions is defined with a plurality of second grooves; and a sum of a depth of each of the first grooves and a depth of each of the second grooves corresponding to each of the first grooves is less than a thickness of the support member.

2. The support member according to claim 1, wherein the first grooves are arranged in an array on the first surface, the second grooves are arranged in an array on the second surface; and each of the first grooves corresponds to each of the second grooves, and an orthographic projection of each of the first grooves on the second surface completely coincides with each of the second grooves when the support member is in a flattened state.

3. The support member according to claim 2, wherein a thickness of a portion of the support frame between each of the first grooves and each of the second grooves corresponding to each of the first grooves is greater than or equal to the depth of each of the first grooves, and the thickness of the portion of the support frame between each of the first grooves and each of the second grooves corresponding to each of the first grooves is greater than or equal to the depth of each of the second grooves.

4. The support member according to claim 2, wherein a depth of each of the first grooves and a depth of each of the second grooves are equal, and a thickness of a portion of the support frame between each of the first grooves and each of the second grooves corresponding to each of the first grooves is equal to the depth of each of the first grooves.

5. The support member according to claim 2, wherein the first grooves and the second grooves are arranged in an array along a length direction and a width direction of the support member;

in a same one of the non-bending regions, a distance between any two adjacent first grooves arranged along the length direction of the support member and a distance between any two adjacent first grooves arranged along the width direction of the support member are equal to a first pitch; and in the same one of the non-bending regions, a distance between any two adjacent second grooves arranged along the length direction of the support member and a distance between any two adjacent second grooves arranged along the width direction of the support member are equal to a second pitch, and the first pitch is equal to the second pitch.

6. The support member according to claim 5, wherein the first pitch is greater than or equal to 6 millimeters, and the second pitch is greater than or equal to 6 millimeters.

7. The support member according to claim 2, wherein a distance between the first grooves adjacent to an edge of the support frame and the edge of the support frame is greater than or equal to a distance between any two adjacent first grooves in a same one of the non-bending regions.

8. The support member according to claim 1, wherein a cross-sectional shape of each of the first grooves is same as or similar to a shape of each of the non-bending regions, and a cross-sectional shape of each of the second grooves is same as or similar to the shape of each of the non-bending regions.

9. The support member according to claim 1, wherein cross-sectional shapes of each of the first grooves and each of the second grooves comprise at least one of square, rectangular, or circular.

10. The support member according to claim 1, wherein each end of two opposite ends of the support frame comprises two first corners, and a side surface of each of the first corners is provided with a first arc surface.

11. The support member according to claim 10, wherein each of the first grooves comprises four second corners, and a side surface of each of the second corners is provided with a second arc surface;

each of the second grooves comprises four third corners, and a side surface of each of the third corners is provided with a third arc surface;

the second arc surface of one of the second corners adjacent to one of the first corners is coaxial with the first arc surface of one of the first corners; and the third arc surface of one of the third corners adjacent to one of the first corners is coaxial with the first arc surface of one of the first corners.

12. The support member according to claim 1, wherein the first grooves and the second grooves are filled with plastic layers.

13. The support member according to claim 12, wherein material of the plastic layers comprises hard resin.

14. The support member according to claim 1, wherein material of the support frame comprises metal.

15. The support member according to claim 1, wherein a portion of the support frame corresponding to the bending region is defined with a plurality of through holes passing through the support member in the thickness direction, the through holes are symmetrically arranged with a bending axis of the support member, any two adjacent through holes are staggered in a direction perpendicular to the bending axis, a length direction of each of the through holes is parallel to the bending axis, a width direction of each of the through holes is perpendicular to the bending axis; and a cross-sectional shape of each of the through holes comprises two symmetrical U-shaped segments with openings facing each other and two arc segments connecting the two U-shaped segments, each of the arc segments is connected to same ends of the two U-shaped segments, and openings of the two arc segments face each other.

16. The support member according to claim 15, wherein an angle of each of the arc segments ranges from 120 degrees to 150 degrees.

17. The support member according to claim 15, wherein in the direction perpendicular to the bending axis, a pitch between two adjacent through holes is greater than 0 micrometer and less than or equal to 100 micrometers, and a width of each of the through holes is greater than 0 micrometer and less than or equal to 200 micrometers.

18. The support member according to claim 17, wherein a length of each of the through holes is greater than or equal to 3.7 millimeters.

19. The support member according to claim 18, wherein in the direction perpendicular to the bending axis, the pitch between two adjacent through holes is greater than or equal to 60 micrometers, the width of each of the through holes is greater than or equal to 120 micrometers, and the length of each of the through holes is less than or equal to 5.7 millimeters.

20. A foldable display module, comprising:
a flexible display panel;

a support member comprising at least one bending region and a plurality of non-bending regions, wherein each bending region is connected between two opposite non-bending regions; the support member further comprises a support frame, the support frame comprises a first surface and a second surface opposite to each other in a thickness direction of the support member, a portion of the first surface of the support frame corresponding to one of the non-bending regions is defined with a plurality of first grooves, and a portion of the second surface of the support frame corresponding to one of the non-bending regions is defined with a plurality of second grooves; and a sum of a depth of each of the first grooves and a depth of each of the second grooves corresponding to each of the first grooves is less than a thickness of the support member; and an adhesive layer disposed between the flexible display panel and the support member.

* * * * *